(12) United States Patent
Duvvury et al.

(10) Patent No.: US 6,933,567 B2
(45) Date of Patent: Aug. 23, 2005

(54) SUBSTRATE PUMP ESD PROTECTION FOR SILICON-ON-INSULATOR TECHNOLOGIES

(75) Inventors: Charvaka Duvvury, Plano, TX (US); Sridhar Ramaswamy, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 100 days.

(21) Appl. No.: 10/146,158

(22) Filed: May 15, 2002

(65) Prior Publication Data

US 2003/0213995 A1 Nov. 20, 2003

(51) Int. Cl.⁷ .............................................. H01L 31/392
(52) U.S. Cl. ...................... 257/347; 257/355; 257/360; 257/361; 257/362
(58) Field of Search ................................ 257/347–349, 257/355, 360–369

(56) References Cited

U.S. PATENT DOCUMENTS

| | | | |
|---|---|---|---|
| 5,698,886 A | * 12/1997 | Thenoz et al. | 257/355 |
| 5,708,288 A | * 1/1998 | Quigley et al. | 257/355 |
| 5,726,844 A | * 3/1998 | Smith | 361/56 |
| 5,811,857 A | * 9/1998 | Assaderaghi et al. | 257/355 |
| 6,369,994 B1 | * 4/2002 | Voldman | 361/56 |
| 2002/0060343 A1 | * 5/2002 | Gauthier et al. | 257/363 |

* cited by examiner

*Primary Examiner*—Hoai Pham
*Assistant Examiner*—Nathan W. Ha
(74) *Attorney, Agent, or Firm*—W. Daniel Swayze, Jr.; W. James Brady; Frederick J. Telecky, Jr.

(57) ABSTRACT

An electrostatic discharge (ESD) protection device formed in the semiconductor layer of a semiconductor-on-insulator device, wherein the semiconductor layer has first and second wells. A discharge circuit is formed in the first well, operable to discharge the ESD pulse to ground. A pump circuit is formed in the second well, operable to use a portion of an ESD pulse's voltage to pump current into the first well for allowing the discharge circuit to turn on uniformly. The discharge circuit has a plurality of body nodes to the first well. The pump circuit comprises an input pad for receiving a portion of the ESD pulse's voltage; an MOS transistor having source, gate and drain; a capacitor connected between the input pad and the gate, whereby a rising input voltage pulls the gate transiently high for pumping current into the first well; the source is connected to the body nodes of the discharge circuit, and the drain connected to the input pad.

13 Claims, 2 Drawing Sheets

SUBSTRATE PUMP ESD PROTECTION FOR SILICON-ON-INSULATOR TECHNOLOGIES

FIELD OF THE INVENTION

The present invention is related in general to the field of electronic systems and semiconductor devices and more specifically to the field of electrostatic discharge (ESD) protection by substrate pump concepts in silicon-on-insulator technologies.

DESCRIPTION OF THE RELATED ART

Integrated circuits (ICs) may be severely damaged by electrostatic discharge (ESD) events. A major source of ESD exposure to ICs is from the charged human body (described by the "Human Body Model", HBM); the discharge of the human body generates peak currents of several amperes to the IC for about 100 ns. A second source of ESD is from metallic objects (described by the "machine model", MM); it can generate transients with significantly higher rise times and current levels than the HBM ESD source. A third source is described by the "charged device model" (CDM), in which the IC itself becomes charged and discharges to ground in rise times less than 500 ps in the opposite direction than the HBM and MM ESD sources. More detail on ESD phenomena and approaches for protection in ICs can be found in A. Amerasekera and C. Duvvury, "ESD in Silicon Integrated Circuits" (John Wiley & Sons LTD. London 1995), and C. Duvvury, "ESD: Design for IC Chip Quality and Reliability" (Int. Symp. Quality in El. Designs, 2000, pp. 251–259; references of recent literature).

ESD phenomena in ICs are growing in importance as the demand for higher operating speed, smaller operating voltages, higher packing density and reduced cost drives a reduction of all device dimensions. This generally implies thinner dielectric layers, higher doping levels with more abrupt doping transitions, and higher electric fields—all factors that contribute to an increased sensitivity to damaging ESD events.

The most common protection schemes used in metaloxide-semiconductor (MOS) ICs rely on the parasitic bipolar transistor associated with an nMOS device whose drain is connected to the pin to be protected and whose source is tied to ground. The protection level or failure threshold can be set by varying the nMOS device width from the drain to the source under the gate oxide of the nMOS device. Under stress conditions, the dominant current conduction path between the protected pin and ground involves the parasitic bipolar transistor of that nMOS device. This parasitic bipolar transistor operates in the snapback region under pin positive with respect to ground stress events.

The dominant failure mechanism, found in the nMOS protection device operating as a parasitic bipolar transistor in snapback conditions, is the onset of second breakdown. Second breakdown is a phenomenon that induces thermal runaway in the device wherever the reduction of the impact ionization current is offset by the thermal generation of carriers. Second breakdown is initiated in a device under stress as a result of self-heating. The peak nMOS device temperature, at which second breakdown is initiated, is known to increase with the stress current level.

Many circuits have been proposed and implemented for protecting ICs from ESD. One method is biasing the substrate of ESD protection circuits in an IC. Such substrate biasing can be effective in improving the response of a multi-finger MOS transistor which is used to conduct an ESD discharge to ground. Substrate biasing, however, can cause the threshold voltages for devices to change from their nominal values, thus affecting device operation. In addition, substrate biasing under steady-state condition generates heat and increases power losses.

In the recent U.S. Pat. No. 5,940,258, issued Aug. 17, 1999 (Duvvury, "Semiconductor ESD Protection Circuit"), a substrate pump ESD protection bias technique has been described for standard epitaxial and non-epitaxial devices. This concept has been successfully applied to bulk CMOS technologies, including devices with thin epitaxial silicided features. Unfortunately, the described technique cannot be applied to devices using the silicon-on-insulator structure, because in the latter devices, the substrate is not accessible. In addition, gate-coupled nMOS cannot be used due to the reduced breakdown voltage during circuit application.

In U.S. Pat. No. 6,208,493, issued Mar. 27, 2001 (Duvvury, "Method and System for Protecting Integrated Circuits against a Variety of Transients"), a multi-chip device is described. The device consists of a first chip which is separate from, but electrically interconnected with the second chip. The IC of the first chip receives and dissipates a high-energy pulse, the IC of the second chip initiates the action of the first IC by using a portion of the incoming pulse and delivering that portion to the first IC. However, two chips with separate substrates are needed; the method can thus not be applied to silicon-on-insulator structures.

An urgent need has therefore arisen for a coherent, low-cost method of ESD protection devices compatible with silicon-on-insulator technology. The device structures should further provide excellent electrical performance, mechanical stability and high reliability. The fabrication method should be simple, yet flexible enough for different semiconductor product families and a wide spectrum of design and process variations. Preferably, these innovations should be accomplished without extending production cycle time, and using the installed equipment, so that no investment in new manufacturing machines is needed.

SUMMARY OF THE INVENTION

The present invention describes electrostatic discharge (ESD) protection devices formed in the semiconductor layer of a semiconductor-on-insulator device, wherein the semiconductor layer has first and second wells. A discharge circuit is formed in the first well, operable to discharge the ESD pulse to ground. A pump circuit is formed in the second well, operable to use a portion of an ESD pulse's voltage to pump current into the first well for allowing the discharge circuit to turn on uniformly.

The discharge circuit has a plurality of body nodes to the first well. The pump circuit comprises an input pad for receiving a portion of the ESD pulse's voltage; an MOS transistor having source, gate and drain; a capacitor connected between the input pad and the gate, whereby a rising input voltage pulls the gate transiently high for pumping current into the first well, the source connected to the body nodes of the discharge circuit, and the drain connected to the input pad.

It is a technical advantage that the voltage of the ESD pulse itself is used to initiate uniform turn-on of the protection transistor for discharging the ESD pulse to ground. This scheme eliminates the need for specific auxiliary circuits to insure uniform turn-on.

Another advantage of the invention that in designing the transistors in the first and the second well, many configurations may be chosen, preferably elongated geometries.

Another advantage of the invention is that all considerations hold also for circuit designs using PMOS transistors by simply inverting polarities and doping types.

Yet another technical advantage of the present method of preventing ESD damage is that it may be implemented using standard semiconductor processing techniques. The present ESD protection circuitry, therefore, does not add significant processing time or expense to the integrated circuit.

The technical advances represented by the invention, as well as the aspects thereof, will become apparent from the following description of the preferred embodiments of the invention, when considered in conjunction with the accompanying drawings and the novel features set forth in the appended claims.

DETAILED DESCRIPTION OF THE PREFERRED EMBODIMENTS

The present invention is related to U.S. Pat. No. 5,940,258, issued on Aug. 17, 1999 (Duvvury, "Semiconductor ESD Protection Circuit"), which is herewith incorporated by reference.

Figure 1:
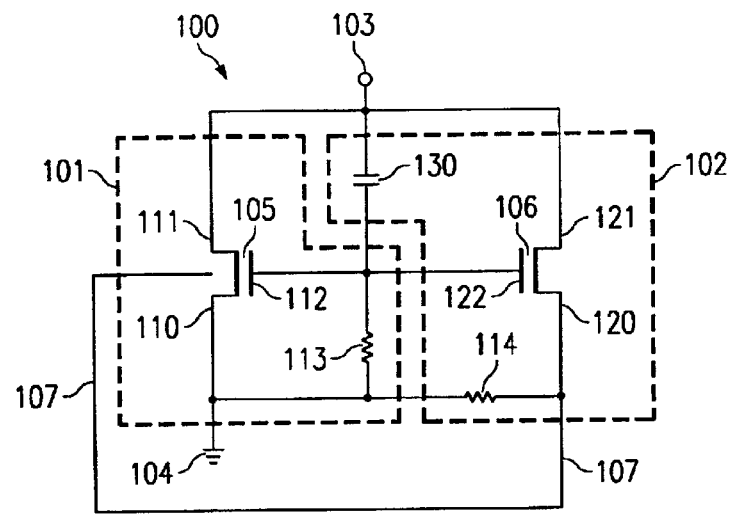
FIG. 1 (prior art) is an ESD protection circuit having a substrate bias generator scheme, applicable to standard epitaxial and non-epitaxial semiconductor technology.

FIG. 1 displays an ESD protection circuit, generally designated 100, in known technology. Protection circuit 100 consists of a discharge circuit 101 to ground, and a substrate bias generator circuit 102 that uses a portion of the ESD pulse's energy to bias the substrate of the discharge circuit. The protection circuit 100 has an input, or pad, 103, ground potential 104, an MOS transistor 105 in the discharge circuit 101, and an MOS transistor 106 in the bias generator circuit 102.

Discharge circuit 101 has MOS transistor 105 designed as a multi-finger transistor. Its source 110 is connected to ground 104, its drain 111 is connected to input 103, and gates 112 are tied through resistor 113 to ground 104.

In the bias generator circuit 102, source 120 of transistor 106 is connected to body/substrate 107 and also to ground 104 through resistor 114, drain 121 is connected to input 103, and gate 122 to gate 112 of transistor 105 and through resistor 113 to ground 104. The bias generator circuit 102 further includes capacitor 130.

The quoted patent applies to bulk CMOS technologies using standard epitaxial and non-epitaxial semiconductors. The patent introduces the concept of substrate pump ESD protection. When an ESD pulse with a large dV/dt is applied to the input node 103 of the ESD protection circuit, the large dV/dt causes a current I to flow through capacitor 130, having capacitance C, in accordance with the relationship $$I = C \cdot dV/dt.$$

This current causes the voltage at gates 112 and 122 to increase rapidly, turning on transistors 105 and 106. Transistor 105, designed as a multi-finger MOS transistor, may not instantly and simultaneously turn on all fingers and thus may not act properly as a discharge transistor. In contrast, transistor 106 is designed as a single or multi-finger transistor and is fully turned on by the voltage at gate 122 and thus conducts current from input 103 to ground 104 through resistor 114.

As current conducts to ground through resistor 114, substrate 107 rises to a predetermined maximum voltage. This voltage rise subsequently causes also the substrate 107 of the ESD protection transistor 105 to rise. This rise, in turn, allows all of the multi-finger MOS transistor 105 to turn on as a bipolar device. Discharge device 101 then discharges the ESD pulse to ground 104.

ESD protection circuit 100 thus generates a substrate bias simultaneously with the occurrence of an ESD pulse and uses the energy of the ESD pulse to generate the substrate bias.

In semiconductor-on-insulator (SOI) technology, the substrate is not accessible. Consequently, the ESD protection circuit of FIG. 1 cannot be used in SOI technology; further, gate-coupled nMOS transistors cannot be used due to the reduced breakdown voltage during circuit application. The present invention introduces the concept of two separate p-wells for nMOS transistors. It should be noted that, while the embodiments are described for nMOS transistors and p-wells, analogous considerations hold for pMOS transistors and n-wells, by reversing all conductivity types.

Figure 2:
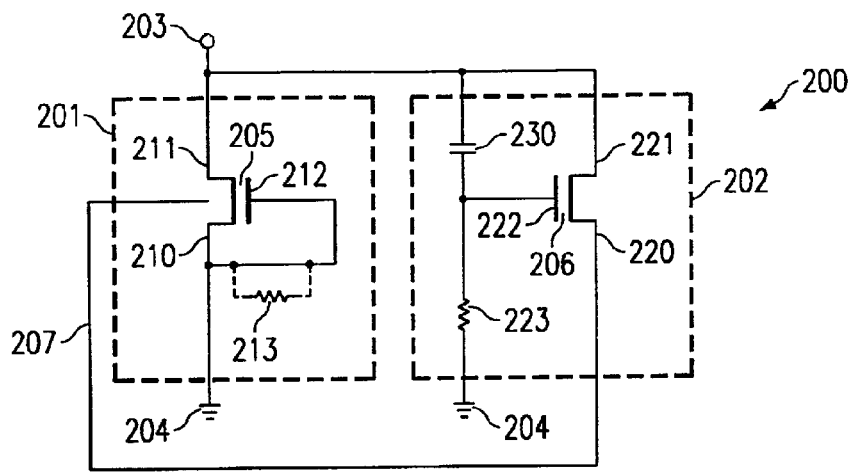
FIG. 2 is an ESD protection circuit having a substrate current pump scheme according to the present invention, applicable to semiconductor-on-insulator (SOI) technology.

FIG. 2 summarizes the present invention and displays an ESD protection circuit, generally designated 200, for SOI technology. Protection circuit 200 consists of a discharge circuit 201, formed in a first p-well, operable to discharge an incident ESD pulse to ground. Further in protection circuit 200 is a drive circuit 202, formed in a second p-well, operable to use a portion of an ESD pulse's voltage to drive current into the first well for allowing the discharge circuit 101 to turn on uniformly. The protection circuit 200 has an input, or pad, 203, ground potential 204, an nMOS transistor 205 in the discharge circuit 201, and an nMOS transistor 206 in the drive circuit 202.

Discharge circuit 201 has nMOS transistor 205 designed as a multi-finger transistor. Its source 210 is connected to ground 204, its drain 211 is connected to input 203, and gates 212 are tied to ground 204. Alternatively, a resistor 213 may be inserted between gate and ground (as indicated by dashed lines in FIG. 2) in order to enhance efficiency. Transistor 205 is designed so that it has a plurality of body nodes to the first p-well, allowing electrical connection to this well. In FIG. 2, a p-well body node is designated 207.

In the drive circuit 202, formed in the second p-well, the source 220 of nMOS transistor 206 is connected to the body/substrate nodes 207 of the discharge circuit in the first p-well. Drain 221 is connected to input 203. The pump circuit 202 further includes capacitor 230. The gate 222 of transistor 206 is tied to capacitor 230 and is further tied, through resistor 223, to ground 204.

When an ESD pulse with a large dV/dt is applied to the input node 203 of the ESD protection circuit, the rising voltage at capacitor 230 pulls gate 222 transiently high so that transistor 206 is turned on and allows current to flow. This current is pumped through the body nodes of transistor 205 into the body of transistor 205. Due to this current driven into the body of the multi-finger transistor 205, discharge transistor 205 can turn on uniformly as a bipolar device and discharge the ESD pulse to ground 204.

Figure 3:
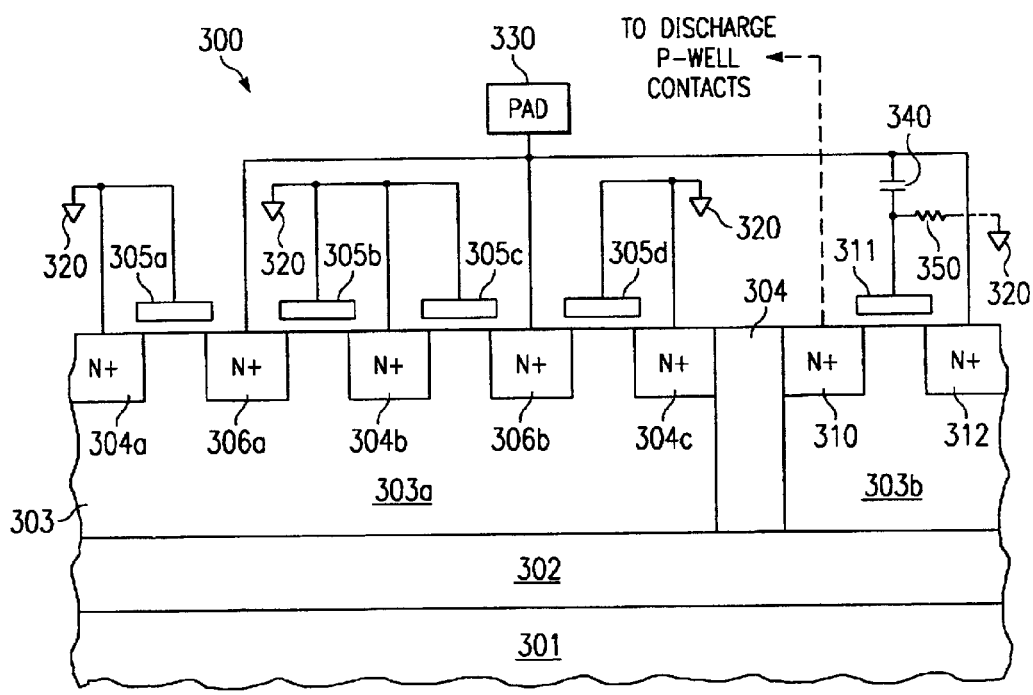
FIG. 3 shows a simplified cross section of an SOI structure, wherein the semiconductor layer comprises two wells according to the invention. The first well comprises the ESD protection nMOS, the second well the pump nMOS.

FIG. 3 is a schematic cross section of an embodiment of the invention, showing an SOI structure generally designated 300, wherein the semiconductor layer comprises two wells. 301 denotes the semiconductor substrate, which is overlaid by an insulating layer 302 (for example, an silicon dioxide layer). The top layer is the epitaxial semiconductor layer 303, typically silicon; in the example chosen for describing the preferred embodiment, epitaxial layer 303 is p-type. The epitaxial layer 303 is thin, preferably in the 50 to 100 nm thickness range. The insulating layer 302, typically silicon dioxide, is preferably 200 to 400 nm thick, and the silicon substrate 301 on the order of several $\mu$m thick.

In this p-epitaxial layer 303, two p-wells 303a and 303b are formed, separated by a shallow trench isolation 304. In the first p-well 303a, the ESD discharge circuit is formed; in the second p-well 303b, the drive circuit is formed. In a multi-finger arrangement, a number of parallel nMOS transistors are formed in each p-well. FIG. 3 shows such a plurality of transistors for the well 303a with the discharge circuit. Each nMOS transistor has source and drain (n+ doped regions) and poly-silicon gate contacts over thin gate insulators.

In the example of FIG. 3, the n+ regions 304a, 304b, and 304c are shown as source of the discharge transistors and connected to ground potential 320. The poly-silicon contacts of the gates 305a, 305b, 305c, and 305d are also connected to ground potential 320. The n+ regions 306a and 306b are shown as drain of the discharge transistors and connected to input pad 330. When an ESD event dV/dt arrives at pad 330, the multi-finger nMOS transistors of the discharge circuit are supposed to turn on uniformly as a bipolar device so that the ESD pulse is discharged to ground without damage (by current crowding and second breakdown) to the IC. This uniformity is provided by the concept of the invention concerning a drive current pumped into the discharge circuit from the drive circuit.

Figure 4:
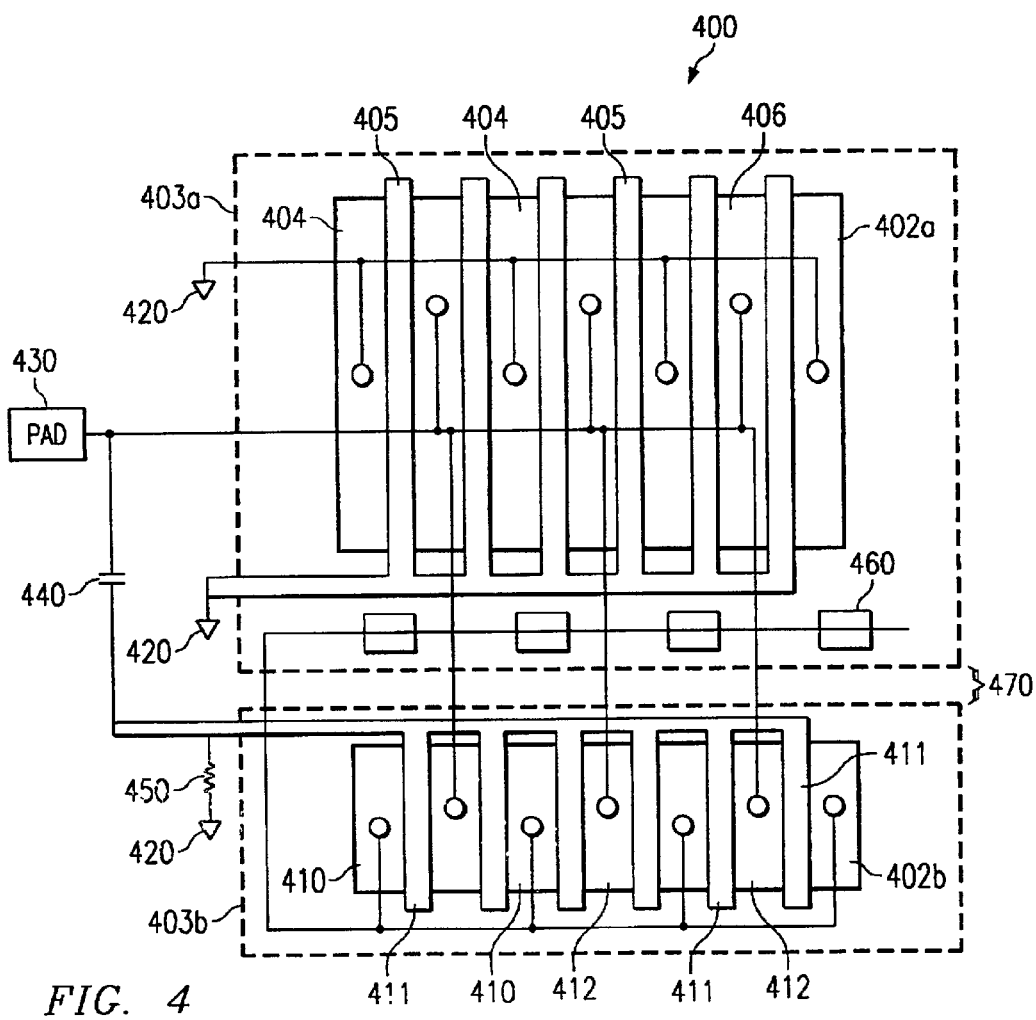
FIG. 4 shows a simplified top view of the two isolated p-wells in the semiconductor layer of an SOI device, one well containing the ESD protection nMOS and circuit and the other well containing the current-pumping nMOS and circuit according to the invention.

In the example of FIG. 3, the drive circuit in the separate p-well 303b is shown as a single nMOS transistor (it may, however, be a multi-finger structure as illustrated in FIG. 4). The n+ region 310 is deoicted as the source of the drive circuit nMOS transistor; source 310 is electrically connected to the plurality of body nodes/contacts of the discharge circuit in well 303a (not shown in FIG. 3). The pump current created in the drive circuit is thus directed into the discharge nMOS transistor in order to insure its uniform turn-on behavior in case of an ESD pulse. The poly-silicon contact 311 of the gate is connected through capacitor 340 to input pad 330, and also through resistor 350 to ground 320. The n+region 312 is depicted as the drain of the drive circuit nMOS transistor; drain 312 is electrically connected to the input pad 330.

FIG. 4 is a simplified top view of the two isolated p-wells 403a and 403b in the epitaxial silicon layer of an SOI ESD protection device generally designated 400. Between the two p-wells is an isolation region 470. P-well 403a can be contacted at selected locations by a plurality of nodes (body ties) 460. It should be noted that these nodes may be given a variety of geometrical shapes, arrangements and distributions. P-well 403a contains the moat 402a with the ESD protection nMOS, p-well 403b contains the moat 402b with the current-pumping nMOS of the drive circuit. In the example of FIG. 4, the protection nMOS as well as the pump nMOS are depicted as multi-finger transistors.

In FIG. 4, the source regions 404 of the discharge transistor in p-well 403a are tied to ground 420. The elongated, finger-shaped poly-silicon contacts of the gate are electrically also connected to ground potential 420. The drain regions 406 are connected to input pad 430.

For the drive circuit in the separate p-well 403b, the source regions 410 of the NMOS transistor in p-well 403b are electrically connected to the nodes/contacts 460 of the p-well 403a in order to pump the drive current into p-well 403a. The poly-silicon contacts 411 of the gate are connected through capacitor 440 to input pad 430, and further through resistor 450 to ground 420. The drain regions 412 are electrically tied to input pad 430.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description.

As an example, the invention can be applied to an electronic device for performing an operation on an energy packet (or signal packet) impinging from outside, wherein the device has first and second wells. The device comprises a first circuit, formed in the first well, operable to perform the operation on said packet. Further, the device comprises a second circuit, formed in the second well and electrically coupled to the first circuit, operable to extract an energy portion (or signal portion) from the packet to initiate and harmonize the performance of the first circuit.

It is therefore intended that the appended claims encompass any such modifications or embodiments.

We claim:

1. A protection circuit for protecting an integrated circuit in a semiconductor-on-insulator device against an ESD pulse, said device having first and second wells, comprising:
   a discharge circuit formed in said first well, operable to discharge said ESD pulse to ground; and
   a drive circuit formed in said second well, operable to use a portion of an ESD pulse's voltage to drive current into said first well for allowing said discharge circuit to turn on uniformly and thus discharge said ESD pulse effectively.

2. A protection circuit for protecting an integrated circuit against an ESD pulse, said protection circuit formed in a semiconductor layer on top of an insulating layer over a semiconductor substrate, comprising:
   a discharge circuit formed in a first well within said semiconductor layer, said discharge circuit operable to discharge said ESD pulse to ground, and having a plurality of body nodes to said first well; and
   a drive circuit formed in a second well within said semiconductor layer, said drive circuit operable to use a portion of an ESD pulse's voltage to drive current into said first well of said discharge circuit for allowing said discharge circuit to turn on uniformly, said drive circuit comprising:
   an input pad for receiving a portion of said ESD pulse's voltage;
   an MOS transistor having source, gate, and drain;
   a capacitor connected between said input pad and said gate, whereby a rising input voltage pulls said gate transiently high for pumping current into said first well;
   said source connected to said body nodes of said discharge circuit; and
   said drain connected to said input pad.

3. The protection circuit according to claim 2 wherein said discharge circuit further comprises:
   an input pad for receiving a portion of said ESD pulse;
   an MOS transistor having source, gate and drain;
   said source and gate tied to ground potential so that leakage from the discharge circuit is minimized; and
   said drain connected to said input pad.

4. The protection circuit according to claim 2 wherein said gate of said drive circuit is further resistively discharged to ground potential.

5. The protection circuit according to claim 3 wherein said discharge circuit MOS transistor is a multi-fingered transistor.

6. The protection circuit according to claim 2 wherein said drive circuit MOS transistor is a multi-fingered transistor.

7. The protection circuit according to claim 1 wherein said second well is separated from said first well by a trench isolation.

8. The protection circuit according to claim 1 wherein said first and second wells are p-type wells.

9. The protection circuit according to claim 2 wherein said discharge circuit MOS transistor and said drive circuit MOS transistor are nMOS transistors.

10. The protection circuit according to claim 2 wherein said body nodes are placed at selected locations in the first well in order to optimize the pumping of the protection circuit nMOS transistor.

11. The protection circuit according to claim 2 wherein said semiconductor layer on top of an insulating layer over a semiconductor substrate has a thickness in the range from 50 to 100 nm; the insulating layer is in the 200 to 400 nm thickness range, and the substrate on the order of several $\mu$m thick.

12. The protection circuit according to claim 2 wherein said capacitor is formed as an MOS device built in the same well as the drive circuit.

13. The protection circuit according to claim 2 wherein said resistor connecting said drive circuit gate to ground is formed as a silicide-blocked poly-silicon or n-well.

* * * * *